(12) United States Patent
Massey et al.

(10) Patent No.: US 9,006,827 B2
(45) Date of Patent: Apr. 14, 2015

(54) RADIATION HARDENED MEMORY CELL AND DESIGN STRUCTURES

(75) Inventors: John G. Massey, Jericho, VT (US); Scott J. McAllister, Pleasant Valley, NY (US); Charles J. Montrose, Clintondale, NY (US); Stewart E. Rauch, III, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 448 days.

(21) Appl. No.: 13/292,629

(22) Filed: Nov. 9, 2011

(65) Prior Publication Data

US 2013/0113043 A1 May 9, 2013

(51) Int. Cl.
*H01L 27/12* (2006.01)
*H01L 21/84* (2006.01)
*H01L 27/11* (2006.01)

(52) U.S. Cl.
CPC ............ *H01L 21/84* (2013.01); *H01L 27/1108* (2013.01); *H01L 27/1203* (2013.01)

(58) Field of Classification Search
CPC ..... H01L 21/74; H01L 21/743; H01L 21/761; H01L 27/0921; H01L 29/0623; H01L 29/7833
USPC .......... 257/347, E27.112, E21.409; 716/110; 438/151, 526
See application file for complete search history.

(56) References Cited

U.S. PATENT DOCUMENTS

| | | | |
|---|---|---|---|
| 5,338,963 A | 8/1994 | Klaasen et al. | |
| 6,001,667 A * | 12/1999 | Saitoh et al. | 438/57 |
| 6,365,447 B1 * | 4/2002 | Hebert et al. | 438/203 |
| 6,365,484 B1 * | 4/2002 | Nowak et al. | 438/386 |
| 6,656,803 B2 | 12/2003 | Chan | |
| 6,686,242 B2 * | 2/2004 | Willer et al. | 438/257 |
| 6,815,282 B2 | 11/2004 | Dachtera et al. | |
| 6,864,156 B1 * | 3/2005 | Conn | 438/459 |
| 7,105,413 B2 | 9/2006 | Nahm et al. | |
| 7,486,541 B2 | 2/2009 | Liaw | |
| 7,638,822 B1 | 12/2009 | de Jong et al. | |
| 7,678,654 B2 * | 3/2010 | Kleint et al. | 438/287 |
| 7,800,184 B2 | 9/2010 | Voldman | |
| 7,808,818 B2 * | 10/2010 | Eitan | 365/185.03 |
| 8,633,096 B2 * | 1/2014 | Greene et al. | 438/530 |
| 2003/0090929 A1 | 5/2003 | Nii | |
| 2004/0222485 A1 * | 11/2004 | Haynie et al. | 257/506 |
| 2008/0142899 A1 * | 6/2008 | Morris et al. | 257/371 |
| 2009/0130805 A1 * | 5/2009 | Babcock et al. | 438/151 |
| 2010/0047985 A1 * | 2/2010 | Dakshina Murthy et al. | 438/303 |
| 2010/0301446 A1 | 12/2010 | Cannon et al. | |
| 2011/0223737 A1 * | 9/2011 | Liu et al. | 438/308 |
| 2011/0291193 A1 * | 12/2011 | Bryant et al. | 257/350 |
| 2012/0112280 A1 * | 5/2012 | Johnson et al. | 257/347 |
| 2013/0164891 A1 * | 6/2013 | Bryant et al. | 438/154 |

* cited by examiner

*Primary Examiner* — Stephen W Smoot
*Assistant Examiner* — Edward Chin
(74) *Attorney, Agent, or Firm* — Anthony Canale; Roberts Mlotkowski Safran & Cole, P.C.

(57) ABSTRACT

A radiation hardened static memory cell, methods of manufacture and design structures are provided. The method includes forming one or more first gate stacks and second gate stacks on a substrate. The method further includes providing a shallow implant process for the one or more first gate stacks such that diffusion regions of the one or more first gate stacks are non-butted junction regions. The method further includes providing a deep implant process for the one or more second gates stack such that diffusions regions of the one or more second gate stacks are butted junction regions.

15 Claims, 6 Drawing Sheets

RADIATION HARDENED MEMORY CELL AND DESIGN STRUCTURES

FIELD OF THE INVENTION

The invention relates to semiconductor structures and, more particularly, to a radiation hardened memory cell, methods of manufacture and design structures.

BACKGROUND

Static random-access memory (SRAM) is a type of semiconductor memory that does not need to be periodically refreshed. The SRAM is comprised of a plurality of NFET and PFET devices organized in such a way as to provide means of storing electrical data. SRAM cell design optimizes size, power, noise margin, performance, and yield. Generally, SRAM must live with the inherent soft error rates (SER), which is given by design and technology. For a large SRAM, usually the only option is the use of error correction circuitry (ECC); however, such circuitry adds chip area and cycle time.

In SOI technology, the SRAM tends to have a lower SER than in bulk technologies. This is because the SRAM devices are isolated from charge generated in the substrate. This isolation, however, decreases the cell node capacitance, making the cell more sensitive to upset such as from radiation events. Also, because of the floating body, charge injected into a device body will induce a bipolar multiplication effect, which increases the effective collected charge. These two effects limit the SER benefit of SOI. Body-ties reduce the bipolar effect; however, these add cell area.

Accordingly, there exists a need in the art to overcome the deficiencies and limitations described hereinabove.

SUMMARY

In an aspect of the invention, a method comprises forming one or more first gate stacks and second gate stacks on a substrate. The method further comprises providing a shallow implant process for the one or more first gate stacks such that diffusion regions of the one or more first gate stacks are non-butted junction regions. The method further comprises providing a deep implant process for the one or more second gates stack such that diffusions regions of the one or more second gate stacks are butted junction regions.

In another aspect of the invention, a structure comprises a silicon-on-insulator (SOI) substrate, formed on an oxide layer. The structure further comprises a first set of devices formed on the SOI substrate. The first set of devices include non-butted diffusion junction regions which form an electrically floating conductive electrical path in the SOI substrate between adjacent devices that share a common well. The structure further comprises a second set of devices formed on the SOI substrate. The second set of devices including butted diffusion junction regions.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of a radiation hardened SRAM cell, which comprises the structures of the present invention. In still further embodiments, a method in a computer-aided design system is provided for generating a functional design model of the radiation hardened SRAM cell.

In embodiments, a method in a computer-aided design system for generating a functional design model of a SRAM cell is provided. The method includes: generating a functional representation of a silicon-on-insulator (SOI) substrate, formed on an oxide layer; generating a functional representation of a first set of devices formed on the SOI substrate, the first set of devices including non-butted diffusion junction regions which form an electrically floating conductive electrical path in the SOI substrate between adjacent devices that share a common well; and generating a functional representation of a second set of devices formed on the SOI substrate, the second set of devices including butted diffusion junction regions.

BRIEF DESCRIPTION OF THE SEVERAL VIEWS OF THE DRAWINGS

The present invention is described in the detailed description, which follows, in reference to the noted plurality of drawings by way of non-limiting examples of exemplary embodiments of the present invention.

DETAILED DESCRIPTION

The invention relates to semiconductor structures and, more particularly, to a radiation hardened memory cell, methods of manufacture and design structures. More specifically, the present invention relates to radiation hardening of an SRAM cell through diffusion and well engineering of the NFET and PFET devices comprising the memory cell. In aspects of the present invention, the diffusion and well engineering is provided in silicon-on-insulator (SOI) material. In more specific embodiments, the SRAM cell includes devices that have junction diffusions made to be "non-butted"; that is, junction diffusions of the devices in the SRAM cell do not contact the buried oxide. This design allows charge to be shared between adjacent devices sharing a common well, e.g., NFET pass gate and cell pulldown devices. In alternative aspects, a buried strap can be formed under the cell node diffusion, e.g., NFET junction diffusions, in order to form non-butted diffusions.

In more specific aspects of the present invention, an SRAM cell is formed on an SOI substrate in a common well. The SRAM cell comprises at least a plurality of adjacent NFETs formed upon an SOI surface layer, where adjacent NFETs comprise source/drain (S/D) junctions which extend partially through the SOI surface layer (i.e., junctions that do not make contact with the underlying oxide layer (e.g., non-butted junctions)). In this way, an electrically floating continuous body region is formed under the non-butted junctions, i.e., region beneath channels and non-butted junctions, shared by the adjacent NFETs. The continuous body region is not body contacted, i.e., the continuous body region is electrically floating. The cell PFET and the logic FETs may comprise butted junctions; that is, the PFET cell and the logic FETs have diffusion junctions that extend completely through the SOI surface layer, making contact with the underlying oxide layer.

Even though the continuous body region of adjacent NFETS of the memory (SRAM) cell is electrically floating, it results in a significant improvement in the soft error rate (SER) performance of the SRAM cell. Also, advantageously, the processes of the present invention do not increase the SRAM cell size or change its layout, nor do the processes require any additional circuitry. Moreover, the radiation hardened SRAM cell of the present invention reduces or eliminates the need for any external error correction (EEC).

For the purposes of this invention, "shallow" and "deep" shall be defined in general to refer to the depth of the diffusion relative to the thickness of the SOI body, regardless of implant dose, energy, etc. Those skilled in the art should also understand that the process details necessary to create these diffusions at the appropriate depth in the SOI body as described herein. Furthermore, "butted" and "non-butted" junctions describe whether or not the diffusions extend through the entire depth of the SOI body, respectively.

Figure 1:
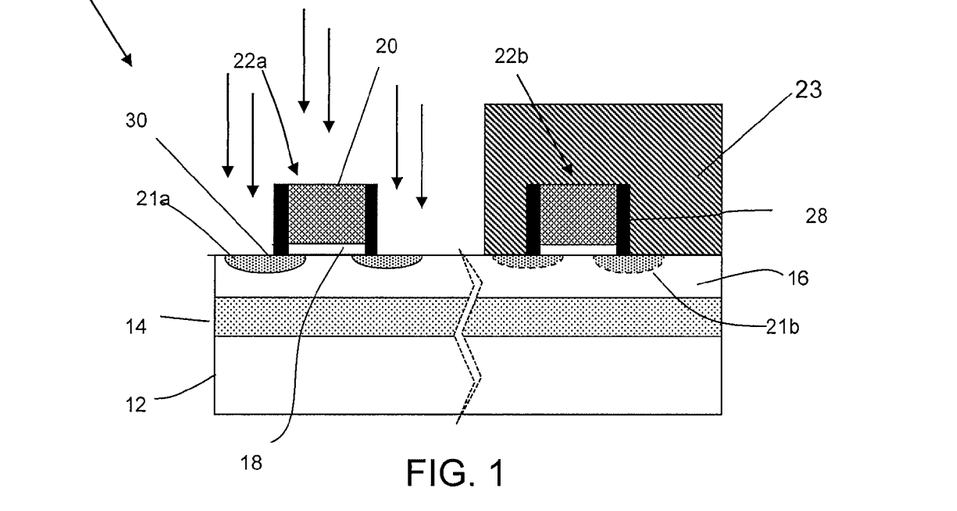
FIGS. 1-3 show structures and respective processing steps in accordance with aspects of the present invention.

FIG. 1 shows a structure and respective processing steps in accordance with aspects of the present invention. More specifically, the structure 10 of the present invention is provided in a silicon-on-insulator (SOI) substrate. The SOI substrate includes, for example, a buried oxide layer (BOX) 14 provided between a Si wafer handler 12 and a Si based substrate 16. The SOI substrate can be fabricated using any conventional technique such as, for example, wafer bonding or SiMOX processes. In embodiments, the Si based substrate 16 can be a thin layer of Si ranging from about 50 nm to about 200 nm and can be extended to other Si thicknesses.

A dielectric layer 18 is formed on the Si based substrate 16. The dielectric layer 18 can be formed using any conventional deposition processes, e.g., chemical vapor deposition (CVD), atomic layer deposition (ALD), etc. In embodiments, the dielectric layer 18 can be any known low-k dielectric material or high-k dielectric material. For example, the low-k dielectric material can be $SiO_2$; whereas, the high-k dielectric material can be hafnium oxide or other hafnium based material. A gate material 20, e.g., poly-silicon material, is formed on the dielectric layer 18 using, for example, conventional deposition methods. Similar to the dielectric layer 18, the dimensions of the gate material 20 can vary depending on the technology node, such that there are no restrictions placed on the dimensions of the dielectric layer 18 and the gate material 20.

The dielectric layer 18 and the gate material 20 undergo a conventional patterning process to form gate stacks 22a and 22b. The patterning process can include, for example, the formation of a resist on the gate material 20, which is then exposed to energy to form a pattern (openings). A conventional etching process, such as, for example, a reactive ion etching (RIE), is then performed to pattern the gate stacks 22a and 22b. In embodiments, the gate stack 22a can be one or more gate stacks representative of an SRAM cell (e.g., NFET pass gate and cell pulldown devices) formed in a common well, and the gate stack 22b can be one or more gate stacks representative of a PFET cell or other logic FETs; although other devices are also contemplated by the present invention. Sidewall spacers 28 are formed on the sidewalls of the gate stacks 22a, 22b. The sidewall spacers 28 can be, for example, oxide or nitride. In embodiments, the sidewall spacers 28 can be deposited and patterned, or grown, using conventional processes.

Still referring to FIG. 1, an extension implant is then performed to begin the formation of source and drain regions 21a, 21b for both the gate stacks 22a, 22b, respectively. In embodiments, the extension implants are formed by a shallow diffusion implant, which will not extend entirely through the Si substrate 16 and hence will not reach the underlying oxide layer 14. In embodiments, as different extension implants are required for the gate stacks 22a, 22b, a mask 23 is provided on one of the gate stacks (shown over gate stack 22b), while the extension implant 21a is formed on the other gate stack (shown as gate stack 22a). To form the extension implants on the other gate stack, this process will then be reversed, by placing the mask over the gate stack 22a while forming extension implants 21b for the gate stack 22b.

Figure 2:
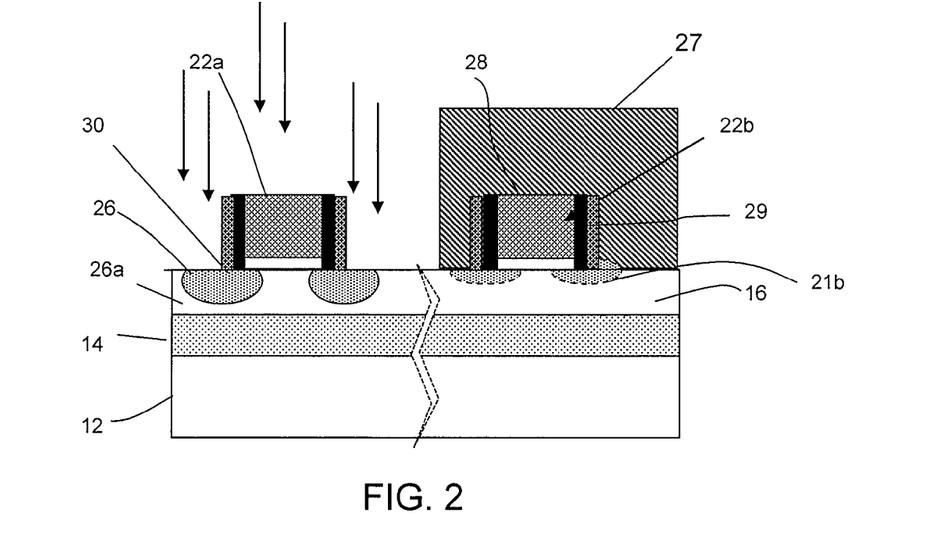

In FIG. 2, a thick sidewall structure 29 is formed on the sidewall spacers 28. In embodiments, the thick sidewall structure 29 can be deposited and patterned, or grown, using conventional processes. Thereafter, a deep S/D implant is performed to form shallow, non-butted diffusion junction regions 26 in the Si substrate 16, for the gate stack 22a. In embodiments, during this implant process, the gate stack 22b is masked 27, as it requires a different type of dopant.

In embodiments, the shallow diffusion junction regions 26 for the gate stack 22a are non-butted regions; that is, the shallow diffusion regions 26 for the gate stack 22a are designed to only partially extend through the thickness of the Si substrate 16, i.e., not reaching to the underlying oxide layer 14. In this way, the non-butted, shallow diffusion junction regions 26 do not contact the underlying oxide layer 14, and a continuous body region 26a formed under the non-butted, shallow diffusion junction regions 26 is electrically floating through the Si substrate 16 (as this region is not body contacted). The non-butted shallow diffusion junction regions 26 are formed using a shallow implant process, which includes, for example implanting 1.5 to $4.5E15/cm^2$ of Arsenic with an energy of 15 to 30 keV. Those of skill in the art should understand that the details of the process to make the shallow diffusion regions 26 depends on the technology implementation of the complete device process and, as such, one of skill in the art would be able to implement the present invention, with many different process details.

By having non-butted shallow diffusion junction regions 26 extending only partially through the Si substrate 16, a partial cancellation of generated charge in a shared well of an SRAM cell, i.e., NFET passgate device and cell pulldown device, can be achieved. More specifically, as the diffusion regions 26 are electrically floating within the Si substrate 16 and the well is shared amongst many devices, a larger charge will now be required in order to disrupt the memory cell. Also, advantageously, the cell PFET and other logic FETs are unchanged and hence require no cell layout change. Accordingly, the present invention takes advantage of the SER benefit of a thin active Si layer, while reducing the mitigating effects, i.e., decreased cell node capacitance and increased effective collected charge in the shared well.

Figure 3:
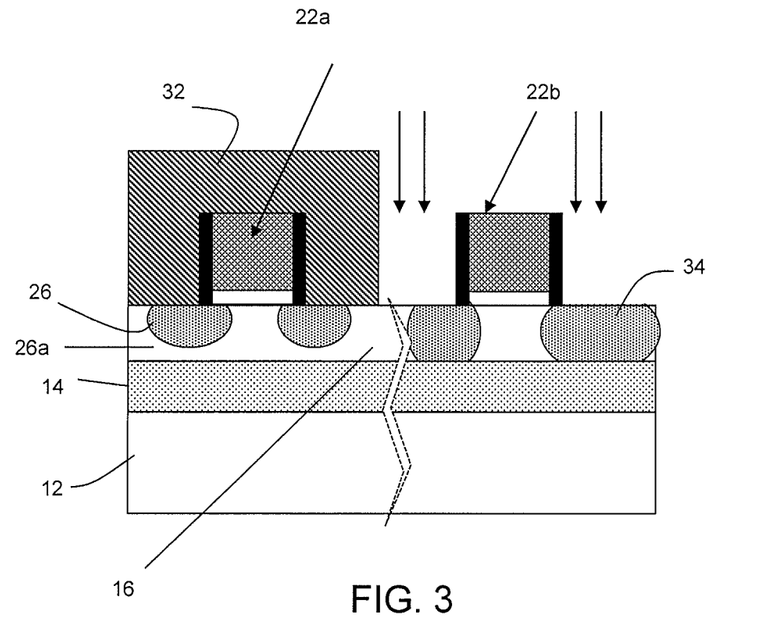

In FIG. 3, the gate stack 22a and related structures can be masked, in order to protect such structures during subsequent deep implantation processes for the gate stack 22b. For example, after masking the gate stack 22a with a mask 32, a deep implant process is provided to form butted diffusion junctions 34 for the gate stacks 22b. The butted diffusion junctions 34 are formed in the Si substrate 16, and extend entirely through the Si substrate 16 thereby making contact to the oxide layer 14. Accordingly, the butted diffusion junctions 34 are not electrically floating in the Si substrate 16. The butted diffusion junctions 34 are formed using a deep implant process, e.g., implanting 1.0 to 4.0E15/cm$^2$ of Boron with energy of 1 to 4 keV. Those of skill in the art should understand that the details of the process to make the butted diffusion junctions 34 depends on the technology implementation of the complete device process and, as such, one of skill in the art would be able to implement the present invention, with many different process details. In embodiments, the butted diffusion junctions 34 are associated with PFET devices in the SRAM memory cells and other FET logic. The mask 32 can then be removed, and back end of the line structures formed, e.g., contacts to the source, drain and gate structures, etc.

Figure 4:
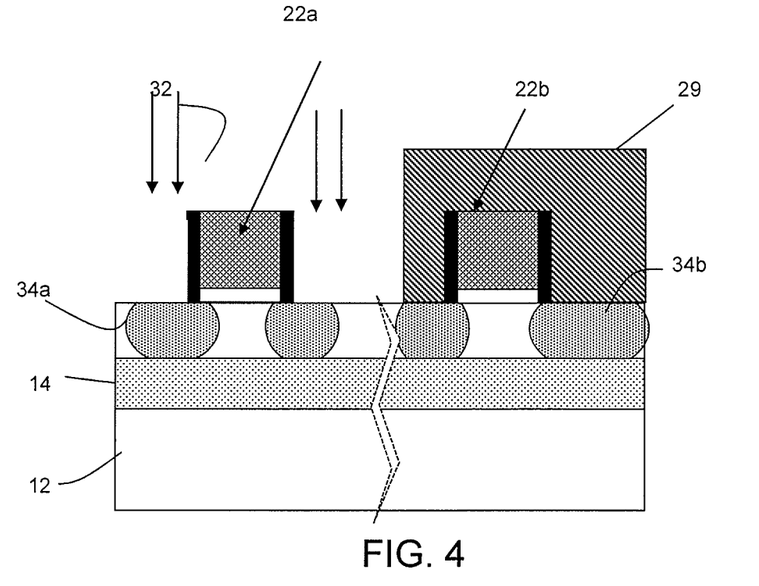
FIGS. 4 and 5 show alternative structures and respective processing steps in accordance with aspects of the present invention.
Figure 5:
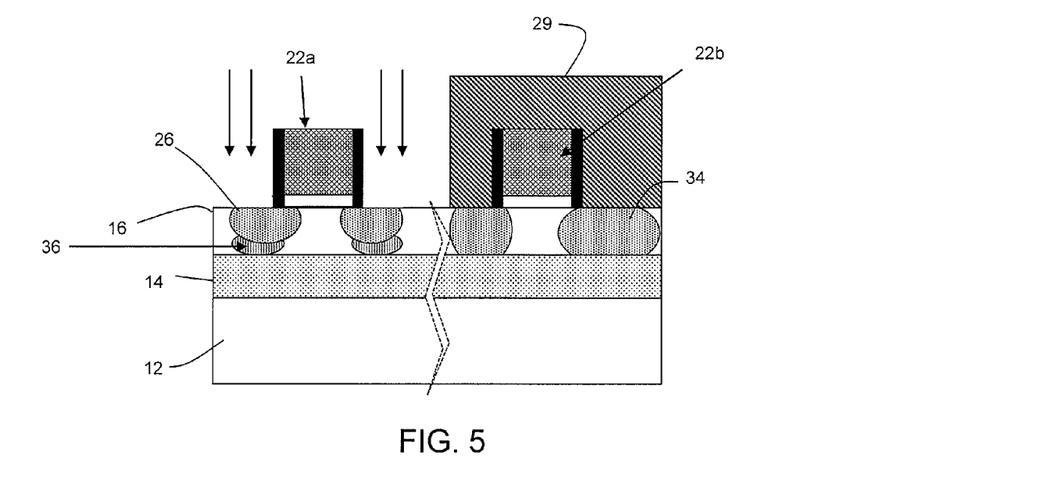

FIGS. 4 and 5 show processing steps in accordance with aspects of the present invention. More specifically, FIGS. 4 and 5 show a process to form a buried diffusion under the gate stack 22a. The buried diffusion of the gate stack 22a will isolate diffusion regions of the gate stack 22a, e.g., NFET passgate device and cell pulldown device, from the buried oxide layer 14, thus forming an electrically conductive pathway in a common well of the gate stack 22a to adjacent devices in the SRAM memory cell.

More specifically, in FIG. 4, a deep implantation process for both the gate stack 22a and gate stack 22b are provided to form butted diffusion junctions 34a and 34b, respectively, i.e., diffusions that make contact with the underlying oxide layer 14. As should be understood by those of skill in the art and as noted above, as the dopant type is different for the gate stack 22a and gate stack 22b, the implant process will be performed on the gate stacks in separate processes. For example, one gate stack will undergo the implant process, while the other gate stack is masked, and vice versa. This is shown representatively by mask 29 formed over the gate stack 22b. In a preferred embodiment, the deep implantation process will be first performed on the gate stack 22b, so that a single mask can be used for subsequent processes, e.g., deep implantation for the gate stack 22b and subsequent buried diffusion formation.

In embodiments, the NFET diffusion deep implant can be, for example, 1.5 to 5.5E15/cm$^2$ of Arsenic with energy of 15 to 45 keV. The diffusion deep implantation process can be provided before or after extension and other implants. Those of skill in the art should understand that the details of the process to make the NFET diffusion deep implant depends on the technology implementation of the complete device process and, as such, one of skill in the art would be able to implement the present invention, with many different process details.

In FIG. 5, a mask (e.g., mask 29) is formed over the gate stack 22b (e.g., PFET logic), and an opposite type of dopant is implanted for the gate stack 22a. The opposite type of dopant will effectively result in a buried diffusion 36 (e.g., strap), resulting in non-butted shallow diffusion junction regions 26 for the gate stack 22a. As in the previous approach, the non-butted shallow diffusion junction regions 26 extend only partially through the SOI surface layer to form a continuous body region shared by adjacent NFETs. The continuous body region allows charges to be shared amongst NFETs formed in a common well. In embodiments, the deep implantation process can be an N type dopant; whereas, the opposite type of dopant for the buried diffusion can be a P type dopant.

Figure 6:
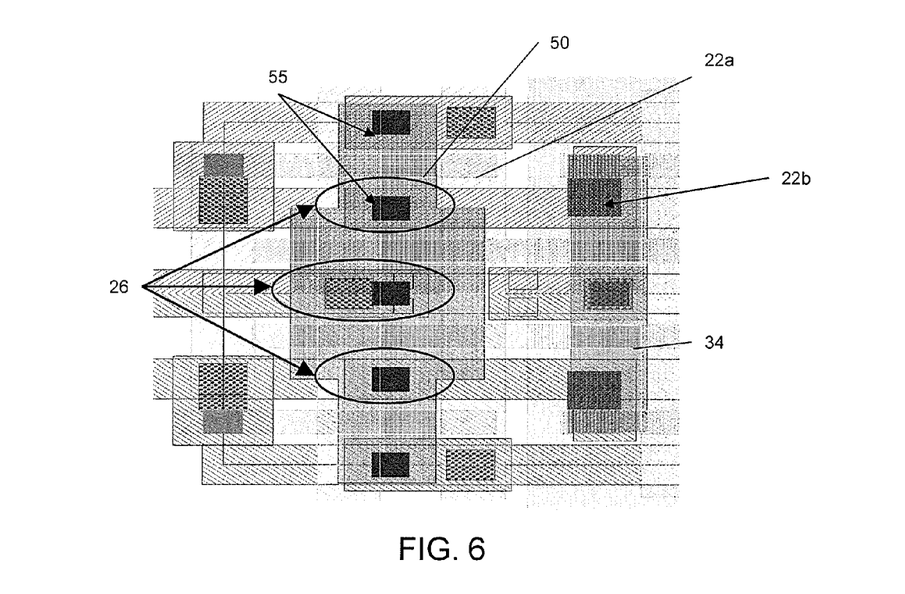
FIG. 6 shows a top view of either FIG. 3 or FIG. 5, in accordance with aspects of the present invention.

FIG. 6 shows a top view of the structure of either FIG. 3 or FIG. 5, in accordance with aspects of the present invention. As shown in FIG. 6, the gate stacks 22a (e.g., NFET memory devices) of SRAM cells share a common well body 50, e.g., P-well. The NFET memory devices 22a also include shared contacts 55, contacting the source and drain regions (non-butted shallow diffusion junction regions 26) of the NFET devices. Also, adjacent NFET memory devices 22a have shared NFET non-butted, shallow diffusion junction regions 26. The structure of FIG. 6 also shows PFET cells 22b within the SRAM memory cell, which have butted diffusion junctions 34.

As should thus be understood, as the NFET memory devices 22a are provided in a common well and the diffusions are non-butted, shallow diffusion junction regions 26, it is possible for the NFET memory devices 22a to share a charge underneath the non-butted diffusion regions 26, e.g., by being electrically floating. In this way, as the NFET memory devices 22a are not electrically isolated from one another, it will take a much larger charge to flip (disrupt) the device, compared to a conventional NFET memory device with butted junctions.

Figure 7:
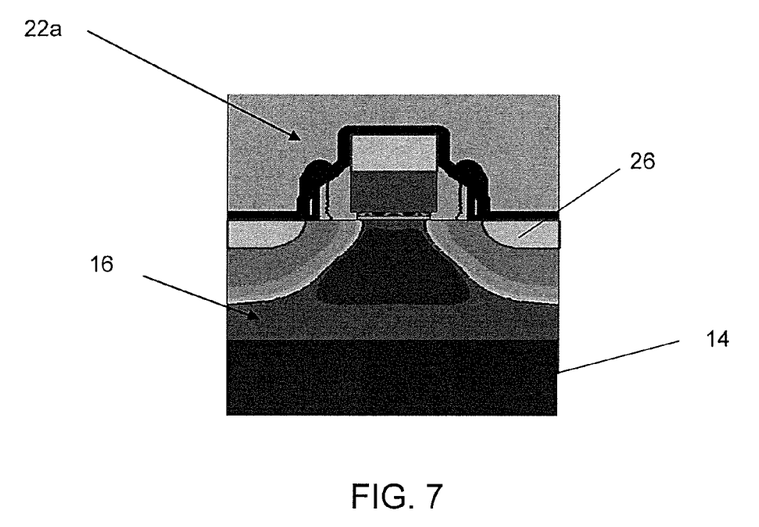
FIG. 7 shows a dopant profile of non-butted, shallow diffusion junction regions of a device in a memory cell in accordance with aspects of the present invention.
Figure 8:
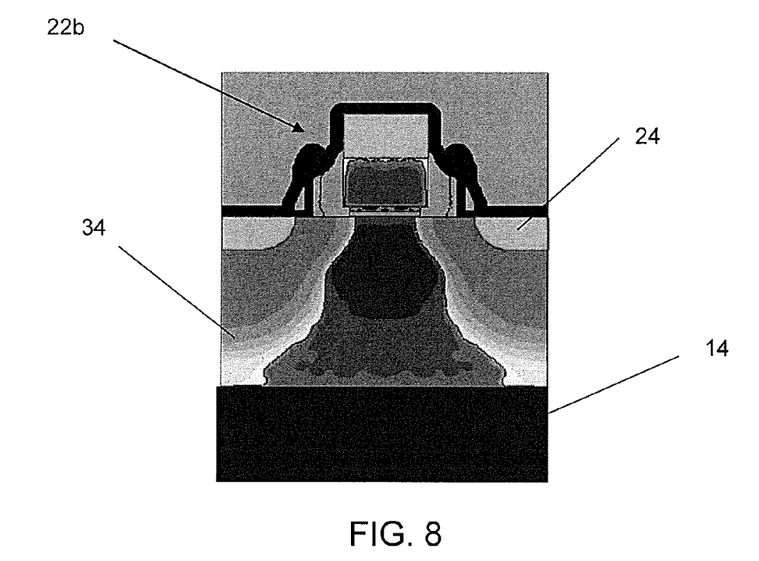
FIG. 8 shows a dopant profile of butted, deep diffusion junction regions of a PFET device in a memory cell or logic cell.

FIG. 7 shows a dopant profile of non-butted shallow diffusion junction regions of a memory cell in accordance with aspects of the present invention. More specifically, FIG. 7 shows a dopant profile of the non-butted, shallow diffusion junction regions 26 of the gate stack 22a. FIG. 8 shows a dopant profile of butted, deep diffusion junction regions of a PFET cell or logic cell. More specifically, FIG. 8 shows a dopant profile of the butted diffusion junctions 34 of the gate stack 22b. As seen from these representations, the non-butted, shallow diffusion junction regions 26 do not make any contact with the oxide layer 14, compared to the butted diffusion junctions 34.

Figure 9:
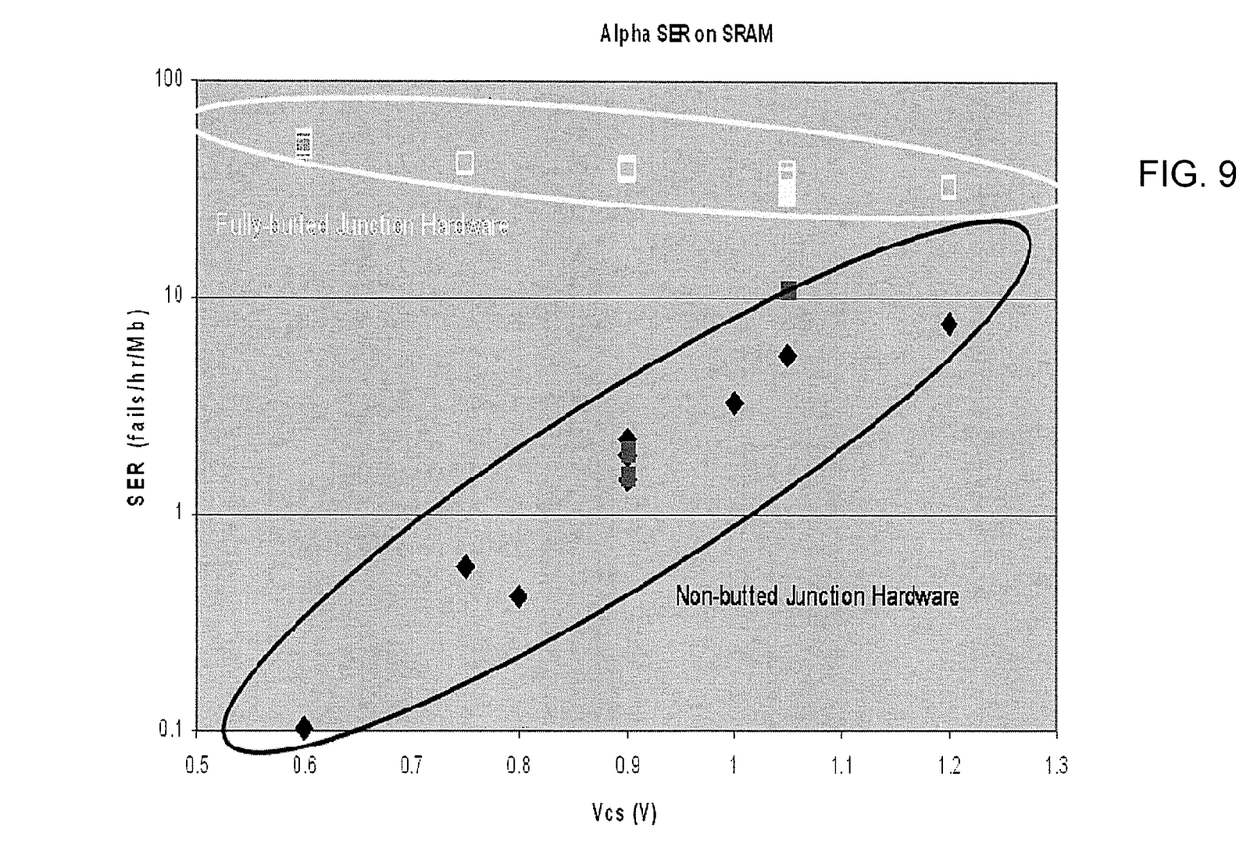
FIG. 9 shows a comparison graph of a soft error rate (SER) of a conventional SOI SRAM cell vs. a SRAM cell with non-butted, shallow diffusion junction regions for the NFET devices in the SRAM cell in accordance with the present invention.

FIG. 9 shows a comparison graph of SER of a conventional SOI SRAM cell with butted NFET diffusions vs. a SRAM cell with non-butted, shallow NFET diffusion junction regions in accordance with the present invention. As shown in FIG. 9, unexpectedly, the NFET SRAM cell of the present invention provides a significant improvement over a conventional SOI NFET SRAM cell. More specifically, a conventional SOI NFET SRAM cell with a fully butted diffusion region has a SER of about 70 to 80 fails per hour per Mb (megabit), compared to 2 to 3 fails per hour per Mb at a voltage of 0.9 V. In fact, in a standby mode, e.g., at a voltage less than 0.9 V, the NFET SRAM cell with non-butted, shallow diffusion junction regions becomes even more hardened, e.g., a 100× or more improvement, compared to a conventional SOI NFET SRAM cell with butted regions.

Figure 10:
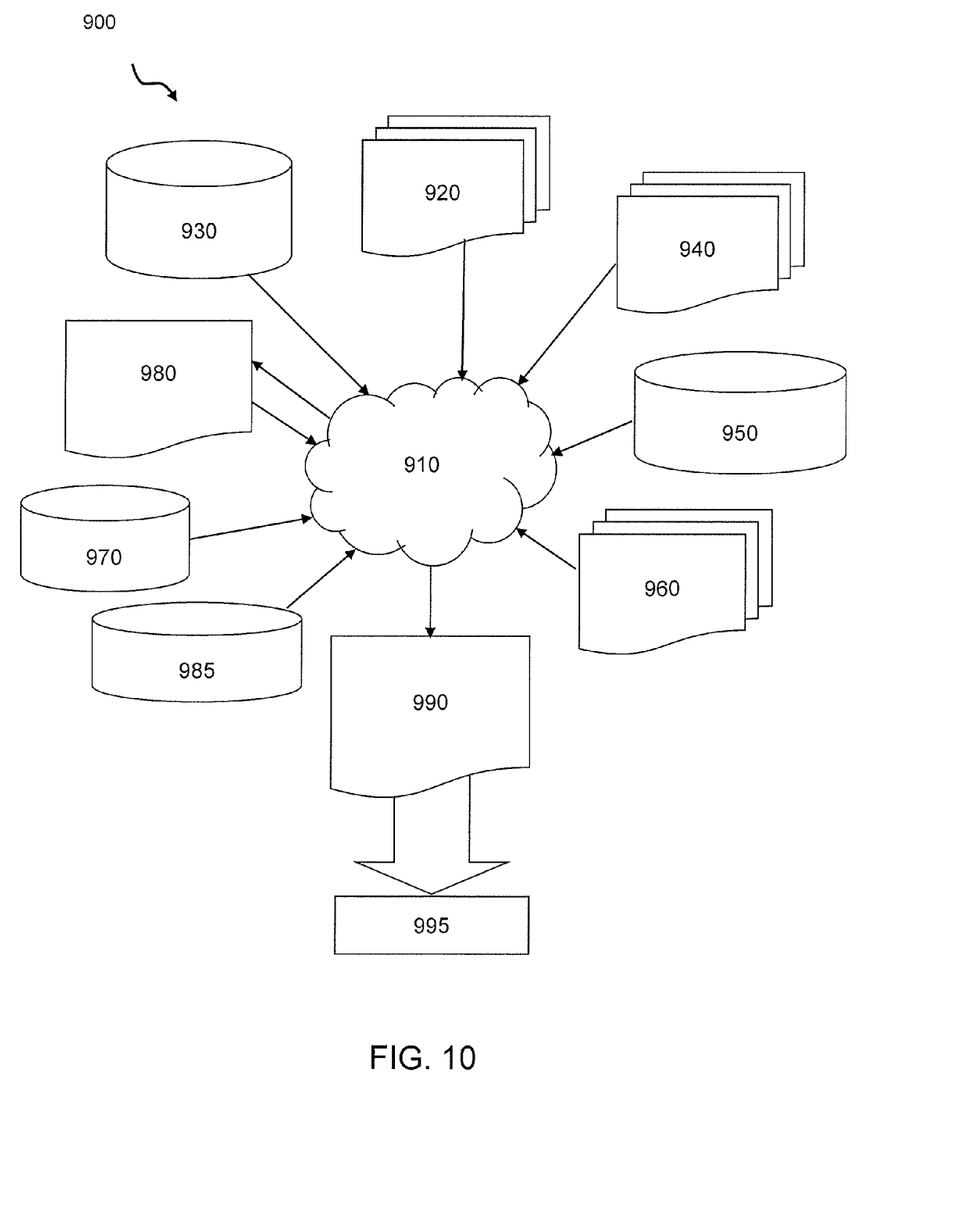
FIG. 10 is a flow diagram of a design process used in semiconductor design, manufacture, and/or test.

FIG. 10 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-8. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 10 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-8. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-8 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g. information stored in an ICES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-8. In one embodiment, design structure 990 may comprise a compiled, executable HDL simulation model that functionally simulates the devices shown in FIGS. 1-8.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-8. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein. The corresponding structures, materials, acts, and equivalents of all means or step plus function elements in the claims, if applicable, are intended to include any structure, material, or act for performing the function in combination with other claimed elements as specifically claimed. Accordingly, while the invention has been described in terms of embodiments, those of skill in the art will recognize that the invention can be practiced with modifications and in the spirit and scope of the appended claims.

What is claimed:

1. A method comprising:
   forming one or more first gate stacks and second gate stacks on a substrate;
   providing a shallow implant process for the one or more first gate stacks such that diffusion regions of the one or more first gate stacks are non-butted junction regions; and
   providing a deep implant process for the one or more second gate stacks such that diffusions regions of the one or more second gate stacks are butted junction regions, wherein:
   the butted junction regions are source/drain (S/D) junctions;
   the butted junction regions are formed in a well;
   the non-butted junction regions are source/drain (S/D) junctions which extend partially through an SOI surface layer; and
   the butted junction regions extend completely through the SOI surface layer, making contact with an underlying oxide layer.

2. The method of claim 1, further comprising masking the one or more first gate stacks during the deep implant process for the one or more second gate stacks.

3. The method of claim 1, wherein the shallow implant process comprises forming a buried diffusion between the non-butted junction regions and an underlying oxide layer.

4. The method of claim 3, wherein forming of the buried diffusion comprises:
   providing a first implant process with a first dopant type which creates a butted diffusion to the underlying oxide layer for both of the one or more first and second gate stacks; and
   providing a second implant process of a second dopant type, opposite of the first dopant type, to create a space between the first dopant type and the underlying oxide layer for the one or more first gate stacks.

5. The method of claim 1, wherein the deep implant process includes providing a shallow implant process, simultaneously, with the one or more first gate stacks and then providing a second implant process such that the butted junction regions contact an underlying oxide layer.

6. The method of claim 1, wherein the one or more first gate stacks are formed in an SRAM cell.

7. The method of claim 1, wherein the one or more second gate stacks are a PFET or other logic cell.

8. The method of claim 1, wherein the non-butted junction regions are provided in a well region.

9. The method of claim 8, wherein the non-butted junction regions form an electrically floating continuous body region shared by adjacent FETs.

10. A method comprising:
    forming one or more first gate stacks and second gate stacks on a substrate;
    providing a shallow implant process for the one or more first gate stacks such that diffusion regions of the one or more first gate stacks are non-butted junction regions; and
    providing a deep implant process for the one or more second gates stacks such that diffusions regions of the one or more second gate stacks are butted junction regions, wherein the non-butted junction regions extend only partially through a silicon-on-insulator (SOI) layer to form an electrically floating continuous body region shared by adjacent NFETs.

11. The method of claim 10, wherein the non-butted junction regions are floating regions in the SOI layer, above an oxide layer.

12. The method of claim 11, wherein the one more first gate stacks are formed on the SOI layer, with an underlying oxide layer.

13. The method of claim 12, wherein the one or more first gate stacks are formed in a common well of the SOI layer.

14. The method of claim 10, wherein the electrically floating continuous body region underlies the non-butted junction regions thereby allowing charges to be shared amongst adjacent NFETs that share the common well.

15. The method of claim 12, wherein the butted junction regions contact the oxide layer.

* * * * *